United States Patent [19]
Cuomo et al.

[11] Patent Number: 5,622,635
[45] Date of Patent: Apr. 22, 1997

[54] METHOD FOR ENHANCED INDUCTIVE COUPLING TO PLASMAS WITH REDUCED SPUTTER CONTAMINATION

[75] Inventors: Jerome J. Cuomo, Lincolndale; C. Richard Guarnieri, Somer; Jeffrey A. Hopwood, Brewster, all of N.Y.

[73] Assignee: International Business Machines Corporation, Armonk, N.Y.

[21] Appl. No.: 417,026

[22] Filed: Apr. 5, 1995

Related U.S. Application Data

[62] Division of Ser. No. 5,678, Jan. 19, 1993.

[51] Int. Cl.$^6$ ............................. C03C 25/06; H05H 1/24
[52] U.S. Cl. ................... 216/68; 216/67; 216/70; 204/192.32; 427/569; 427/585; 427/598; 438/731
[58] Field of Search ................... 427/457, 458, 427/569, 585, 587, 598; 216/2, 58, 63, 67, 68, 70; 204/192.32, 298.31, 298.34; 156/345, 643.1; 118/723 E, 723 I, 723 IR

[56] References Cited

U.S. PATENT DOCUMENTS

| | | | |
|---|---|---|---|
| 3,369,991 | 2/1968 | Davidse et al. | 204/298 |
| 3,705,091 | 12/1972 | Jacob | 204/312 |
| 4,512,283 | 4/1985 | Bonifield et al. | 118/723 |
| 4,574,733 | 3/1986 | Nath et al. | 118/718 |
| 4,818,359 | 4/1989 | Jones et al. | 204/298 |
| 4,918,031 | 4/1990 | Flamm et al. | 437/225 |
| 4,948,458 | 8/1990 | Ogle | 156/643 |
| 4,985,109 | 1/1991 | Otsubo et al. | 156/345 |
| 5,030,885 | 7/1991 | Holmes | 315/111 |
| 5,036,794 | 8/1991 | Yamazaki et al. | 118/723 |
| 5,091,049 | 2/1992 | Campbell et al. | 156/643 |
| 5,102,496 | 4/1992 | Savas | 156/643 |
| 5,234,529 | 8/1993 | Johnson | 156/345 |
| 5,277,751 | 1/1994 | Ogle | 118/723 I |

FOREIGN PATENT DOCUMENTS

| | | |
|---|---|---|
| 0379828 | 1/1990 | European Pat. Off. . |
| 62-166521 | 7/1987 | Japan . |

OTHER PUBLICATIONS

*IBM Technical Disclosure Bulletin*, vol. 30, No. 5, Oct. 1987, "Ion Getter Trap for Water Vapor," pp. 93–95.
*J. Vac. Sci. Technol.*, "Development of rf Plasma Generators For Neutral Beams," A 3 (3), May/Jun. 1985, pp. 1218–1221.

Primary Examiner—R. Bruce Breneman
Assistant Examiner—Rodney G. McDonald
Attorney, Agent, or Firm—Sterne, Kessler, Goldstein, & Fox, P.L.L.C.; Daniel P. Morris

[57] ABSTRACT

A method of gas plasma treating a workpiece in a process chamber having RF coil outside the chamber, a flat dielectric window, and a electrically conducting shield, adapted to be located between the RF coil and the dielectric window. The shield comprises a planar body section having a periphery, central opening, and outer gaps forming a substantially continuous opening about the periphery. A uniform magnetic field, inductively coupled with the plasma, is formed by routing the flux lines of the magnetic field through the central opening and outer gaps of the shield. Contamination from sputtering is substantially eliminated by reducing the capacitive electric fields generated by the coil that interfere with the inductive coupling between the coil and the gas plasma.

10 Claims, 9 Drawing Sheets

5,622,635

METHOD FOR ENHANCED INDUCTIVE COUPLING TO PLASMAS WITH REDUCED SPUTTER CONTAMINATION

This application is a division of application Ser. No. 08/005,678, filed Jan. 19, 1993, (allowed).

TECHNICAL FIELD

This invention relates generally to the field of semiconductor device manufacturing, and specifically to plasma-based processes with reduced sputter contamination.

BACKGROUND ART

The uniform and rapid processing of materials using induction generated, plasma-based processes (also referred to as inductive-coupled plasma processes) is important in the fields of semiconductor device manufacturing, packaging, optics, and the like. Many plasma processes are extensively used for the depositing or reactive etching of layers during semiconductor device fabrication. However, the radio frequency (RF at about 13.56 MHz) induction plasma source is known to produce high electron density ($n_e > 10^{11}$ cm$^{-3}$) plasmas, thus providing high processing rates.

One conventional apparatus described in U.S. Pat. No. 3,705,091 to Jacob, produces a high density plasma which consists of a helical coil energized by 13 MHz RF radiation. The plasma is generated inside a low pressure cylindrical vessel within the helical coil. The coil structure induces electric fields within the plasma region which drive the discharge. High RF potentials on the coil cause capacitive coupling with the vessel walls. The capacitive coupling accelerates charged particles (electrons and ions) from the plasma into the dielectric vessel walls causing process contamination due to sputtering of the dielectric vessel walls. In addition, capacitive coupling is much less efficient than inductive coupling.

M. C. Vella et al. in *Development of R.F. Plasma Generators for Neutral Beams*, (Journal of Vacuum Science Technology, Vol. A3(3), pp. 1218–1221 (1985)), describe an inductive-coupled plasma process having a coil immersed in a plasma that is confined by permanent magnets. This apparatus also exhibits a degree of capacitive coupling to the discharge since the coil is in contact with the plasma.

D. K. Coultras et al. in European Patent Application 0 379 828 and Ogle in U.S. Pat. No. 4,948,458, describe inductive-coupled plasma process using a spiral coil separated from the plasma by a planar dielectric called a window. Again, high potentials on the coil cause some degree of capacitive coupling, and thus contamination of the process due to sputtering of the dielectric window.

In U.S. Pat. No. 4,918,031, Flamm et al. describe a helical resonator with a coil similar to that of Jacob in which a split cylindrical ground shield is placed between the coil and the vacuum vessel such that high fields from the coil are shorted to ground. Capacitive coupling is essentially eliminated in this configuration. However, the cylindrical geometry of this device does not allow efficient use of the ions and reactive species on large area substrates such as semiconductor wafers. Additionally, the cylindrical geometry can not be scaled for use with very large area substrates such as liquid crystal displays.

What is desired is a technique for both eliminating capacitive coupling to reduce contamination, and maintaining high inductive coupling between the coil and the plasma for improved processing rates as well as a reactor geometry which is scalable to large areas.

DISCLOSURE OF INVENTION

The present invention is directed to a method for enhanced inductive coupling to plasmas with reduced sputter contamination. The present invention eliminates sputtering of the dielectric window by shunting to ground capacitive electric fields generated by high potentials on the adjacent spiral-like or helical coil. This is achieved by adding grounded conducting elements, called shields, between the dielectric window and the coil.

The shields of the present invention are designed so that they do not interfere with the inductive coupling of the coil to the plasma, but guide capacitive electric fields generated by the coil away from the plasma-window interface and toward ground.

The primary advantage of the present shielding invention is the reduction or elimination of sputtered contaminates from the dielectric vacuum window.

The shields also guide the induction electric field through the plasma in a way such that plasma generation uniformity is improved when helical coils are used.

Another advantage is improved generation of ions in the plasma. This improved generation of ions in the plasma causes increased etch rates compared to the rate achieved using conventional plasma-based processes.

The foregoing and other features and advantages of the invention will be apparent from the following more particular description of preferred embodiments of the invention, as illustrated in the accompanying drawings.

BRIEF DESCRIPTION OF DRAWINGS

The invention will be better understood if reference is made to the accompanying drawings.

In the drawings, like reference numbers indicate identical or functionally similar elements. Additionally, the left-most digit of the reference number identifies the drawing in which the reference number first appears.

BEST MODE FOR CARRYING OUT THE INVENTION

Figure 1:
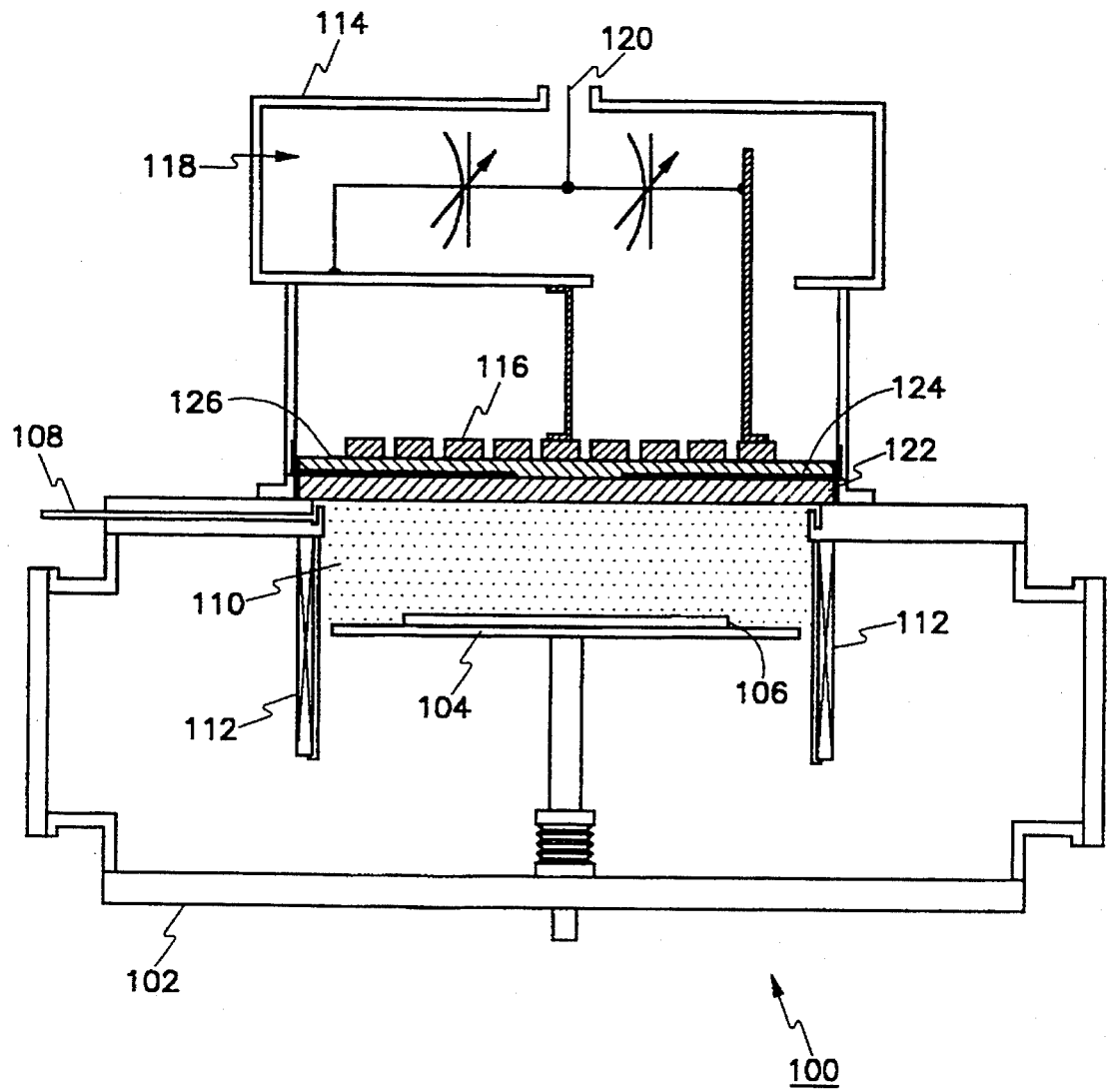
FIG. 1 shows a schematic cross-section of a plasma-based semiconductor device manufacturing apparatus of the present invention.

FIG. 1 shows a schematic cross-section of a plasma-based semiconductor device manufacturing apparatus 100 of the present invention.

A general operational description of an inductive coupled plasma low-pressure chemical vapor deposition (CVD) or reactive ion etching (RIE) apparatus is found in Coultras, et al., and Ogle, the disclosures of which are incorporated herein by reference.

Referring now to FIG. 1 of the present invention, a low-pressure plasma process chamber 102 comprises a substrate holder 104 for supporting a workpiece 106. Other applicable processes include: plasma etching, CVD, surface treatment, atom and radical source, ion beam source and light source (visible, UV, vacuum UV). More specifically, the workpiece 106 is one or more semiconductor wafers, or the like. The process chamber 102 has a process gas inlet 108 through which a process gas is pumped according to conventional techniques. A plasma 110 is generated inside the low-pressure process chamber 102, as will be discussed further below. The process chamber 102 also includes permanent magnets 112 which are used for shaping the plasma 110 during processing.

Attached to the top of the process chamber 102 is an RF housing 114, which is commonly referred to as a "matchbox". Housed within the matchbox 114 is a spiral-shaped coil 116 and an RF impedance-adjusting circuit 118. The RF impedance-adjusting circuit 118 is powered by an RF power input 120. A quartz vacuum window (dielectric window) 122 separates the RF coil 116 from the process chamber 102 and (during operation) the plasma 110. Also separating the RF coil 116 from the process chamber 102 is a conductive shield 124 and insulating layer 126 (such as air, gas, vacuum, or the like) sandwiched between the RF coil 116 and the conductive shield 124.

The spiral coil 116 is generally planar, and is therefore also referred to as a planar coil, but for purposes of this description will be simply referred to as the "coil 116." As evident by inspection of the drawing, coil 116 is located outside of the process chamber and inside of the matchbox 114. The coil 116 is positioned proximate the dielectric window 122, but is separated therefrom by the insulating layer 126 and conductive shield 124. As discussed in Ogle, for example, the planar geometrical shape of coil 116 produces a planar plasma 110 for more even processing of the workpiece 106. Thus, the plane in which the coil 116 lies is substantially parallel to the dielectric window 122 and conductive shield 124. The conductive shield 124 is grounded by connection directly to the matchbox 114, which in turn is connected to process chamber 102.

During operation of the apparatus the conductive shield 124 guides capacitive electric fields generated by the coil 116 away from the dielectric window 122 and to the grounded matchbox 114. This grounding of the capacitive electric fields substantially reduces interference by the capacitive electric fields with the inductive coupling between the coil 116 and the plasma 110.

The basic geometry of conductive shield 124 will now be discussed in connection with FIG. 2. In a preferred embodiment of the present invention, the conductive shield 124 comprises four shield elements 230. The shield elements 230 are made of conductive metal such as copper, aluminum, or the like, having a thickness on the order of about 0.01–1 mm.

The shield elements 230 each comprise a ground lead 232 for connection to an inside wall of the matchbox 114. Other equivalent techniques for grounding the conductive shield 124 should become evident to those skilled in the art.

Each shield element 230 has an inner edge 234, two side edges 236, and an outer edge 238. The side edges 236 and an outer edges 238 define a periphery of the shield 124.

Figure 2:
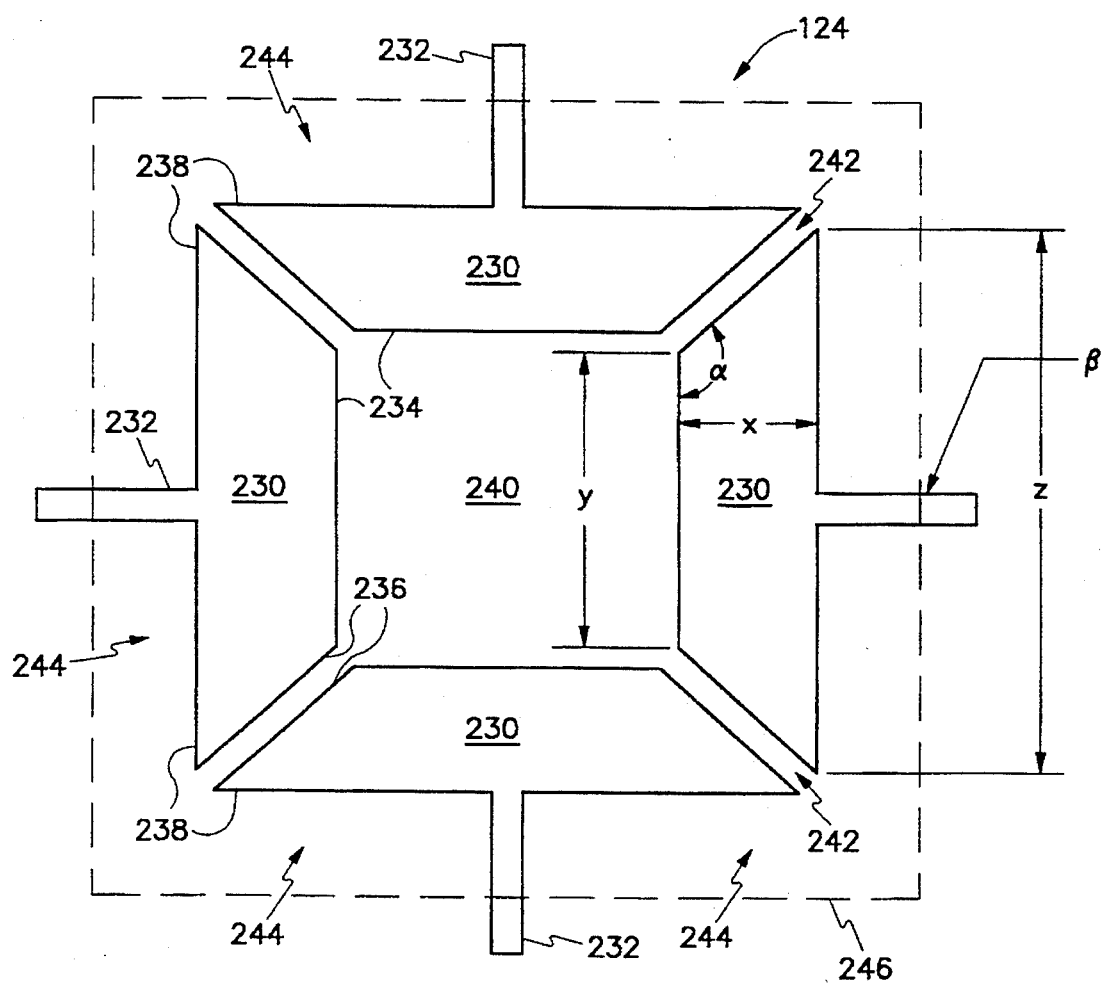
FIG. 2 shows representative drawings of the shields shown in FIG. 1.

A center opening in the conductive shield 124 is defined by the extremities of the four inner edges 234, as shown generally in FIG. 2. In addition, radial gaps 242 are defined by the side edges 236 of adjacent shield elements 230. Finally, outer gaps 244 are defined by the outer edges 238 and the inside wall of the matchbox 114 represented by a dashed line 246.

Representative dimensions of the shield elements 230 will now be discussed with reference to FIG. 2. These dimensions are merely representative of a preferred embodiment of the present invention. Modifications can be made to the general shape of the capacitive shield 124 and shield elements 230 without departing from the spirit and scope of the present invention.

The shield elements 230 are separated by the radial gaps 242 so that there does not exist a completed circular conducting path which would prevent magnetic inductive fields from reaching the plasma region.

In a preferred embodiment, the distance between inner edge 234 and outer edge 238 is represented by the constant x. The lengths of the inner edges 234 and outer edges 238 are represented by the constants y and z, respectively. In this representative embodiment, y is equal to about 2x, and z is equal to about 2y. In this representative embodiment, an angle α between the inner edge 234 and side edge 236 is approximately equal to 135°. With α equal to approximately 35°, the side edges 236 are approximately 1.4x. FIG. 2 also shows a 90° bend at angle β for attaching the ground leads 232 of the shield elements 230 to the interior wall of the matchbox 114. Again, these dimensions are only representative examples of the invention and are not limitations thereof.

The present embodiment is intended for uniform treatment of square substrates. In the case of treatment of circular substrates the periphery of a shield would form a circle. The shape of the shielding modifies the geometry of inductive electric fields for optimal uniformity over various shaped substrates (workpieces). Further, one skilled in the art will recognize that the window, shielding, and coil need not be planar. In the instance of treating dome-like workpieces, it is advantageous to use a domed or hemispherical window. The shielding would then preferably be domed or hemispherical and conformal to the window, but may flat. The coil may then be conformal to the shielding or helical in shape.

Figure 3A:
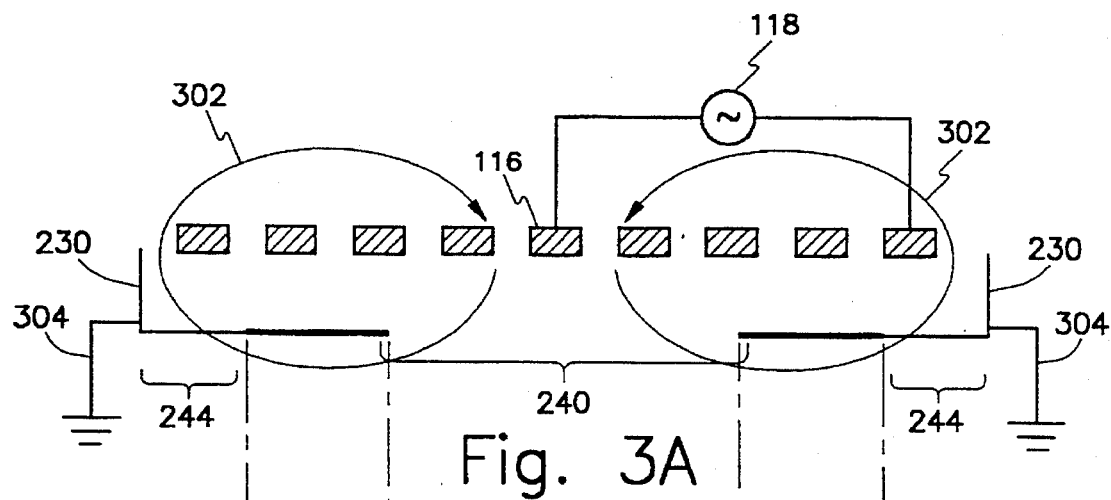
FIGS. 3A and 3B are diagrammatic representations of magnetic flux lines passing around the conductive shield of the present invention.
Figure 3B:
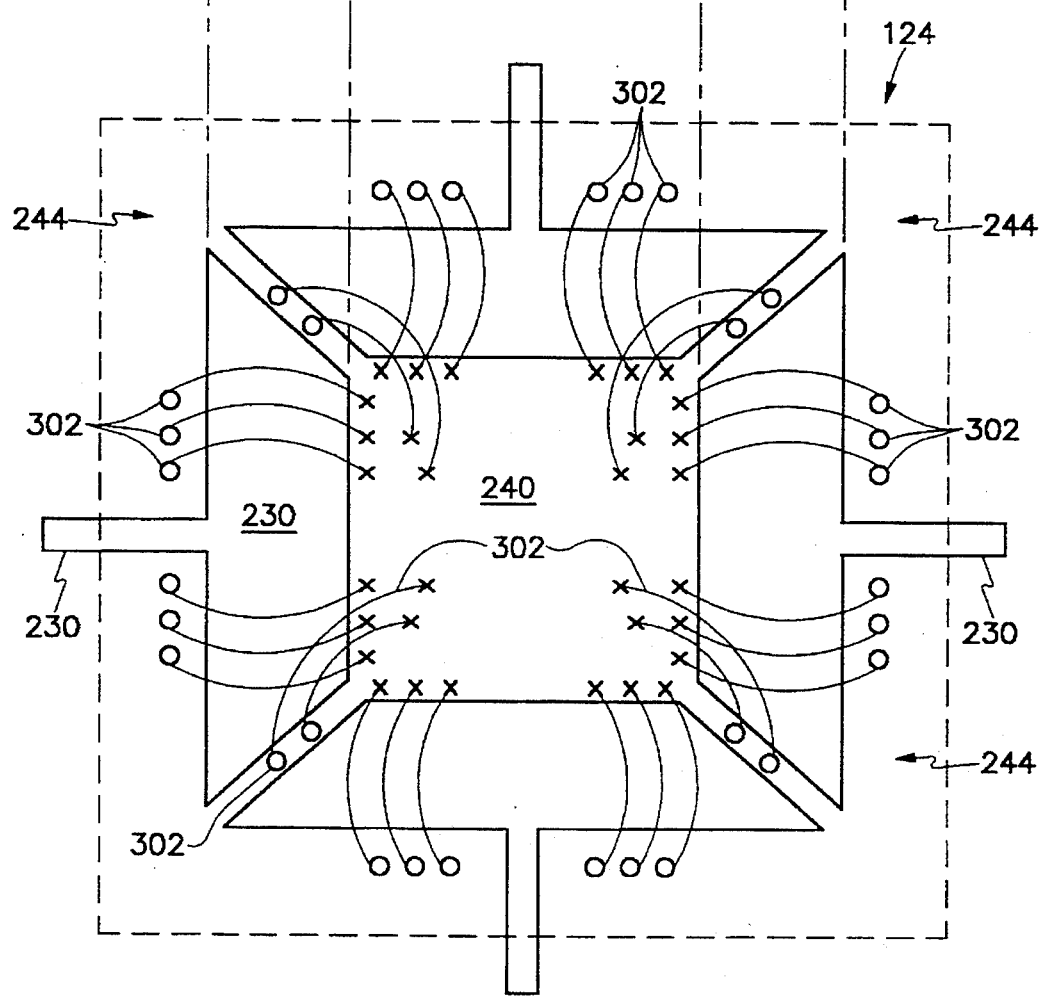

FIGS. 3A and 3B are diagrammatic representations of the capacitive shield 124 and RF magnetic flux lines 302 produced by the coil 116. FIG. 3A is a cross-section of the coil 116 and the shield elements 230. This figure also shows the center opening 240, which permits the RF magnetic flux lines 302 to pass through the dielectric window 122 to generate the plasma 110 (both not shown). The outer gaps 244 permit the RF magnetic flux lines 302 to return to the coil 116, as also shown in the figure. The shield elements 230 are grounded, as shown schematically at 304. FIG. 3B shows a top view of the capacitive shield 124. Again, the RF magnetic flux lines 302 are shown entering the center opening 240 and returning to the coil 116 via the outer gaps 244 and the radial gaps 242.

Because the inner end of the coil 116 is at ground potential, the RF potential on an inner turn or the coil 116 is very low. The shield's central opening 240 thus permits inductively coupling between the coil 116 and the plasma 110 without concern for sputtering of the center of the dielectric window 122 by RF potentials. If, however, the central opening is made too small (less than approximately 1 inch), plasma ignition becomes difficult and a portion of the induction field is excluded from the plasma region by the shield.

Figure 4A:
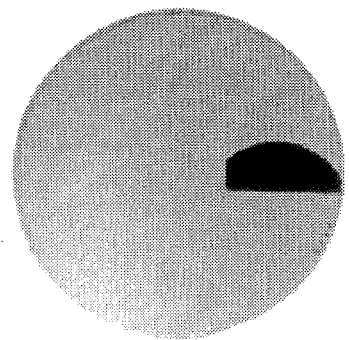
FIGS. 4A and 4B show photographs of polyimide-coated wafers which were etched under identical conditions both with and without capacitive shielding.
Figure 4B:
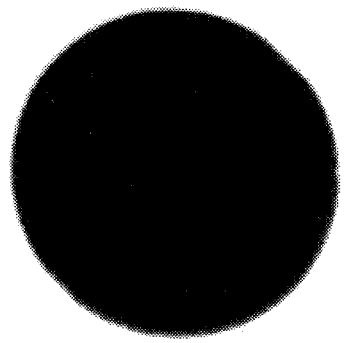

FIGS. 4A and 4B show photographs of polyimide-coated wafers which were etched under identical conditions both with and without the capacitive shielding of the present invention. The unshielded process shown in FIG. 4A produces a wafer which is hazed and rough on the surface.

This roughness is due to micromasking of the surface of the polyimide by silicon sputtered from the quartz window. With the grounded shield elements in place the polyimide on the wafer remains smooth and reflective, as shown in FIG. 4B. Polyimide removal rates are faster with the conductive shield in place. The average etch rate of the wafer etched with the conductive shield of the present invention was 0.75 µm/min. Without shielding the etch rate under identical conditions is 0.55 µm/min. While this increased etch rate may be partly due to the elimination of micromasking, Langmuir probe measurements of the ion flux from the plasma also show an increased ion saturation flux density when shielding is used.

Figure 5:
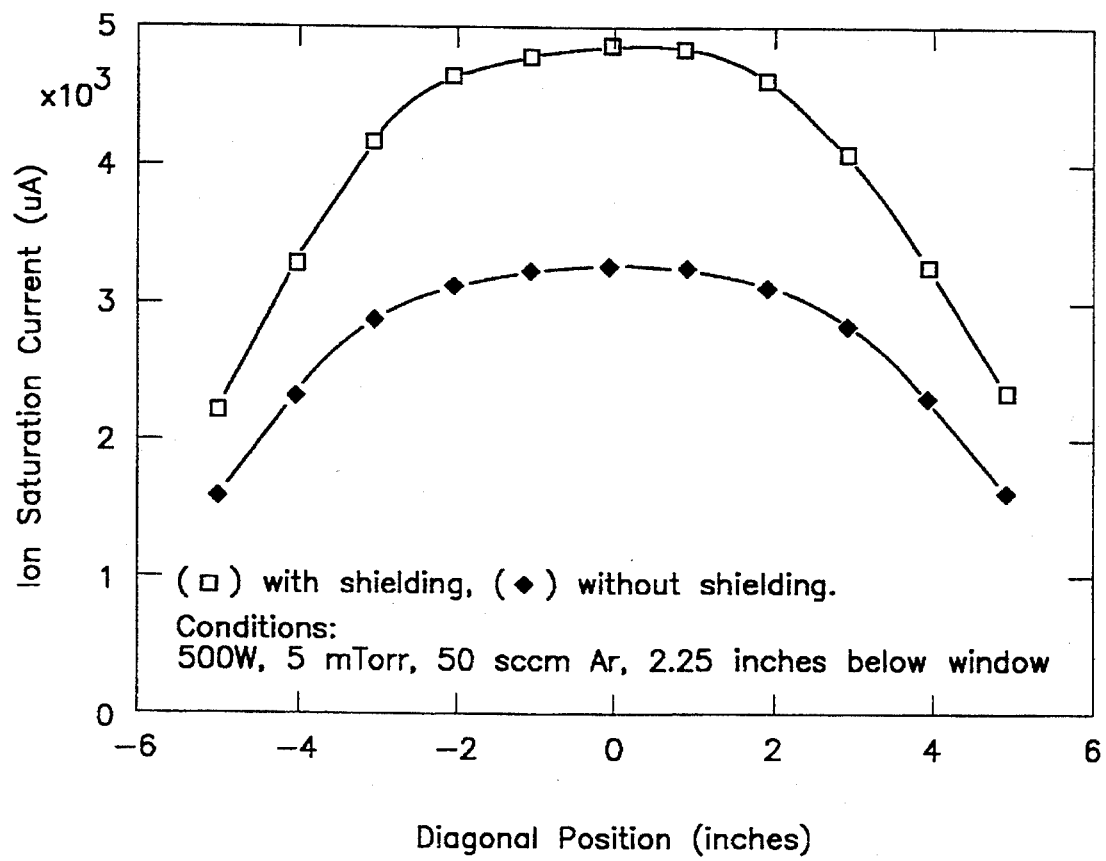
FIG. 5 is a plot showing measured ion saturation current as a function of diagonal position in the plasma with and without shielding.
Figure 6:
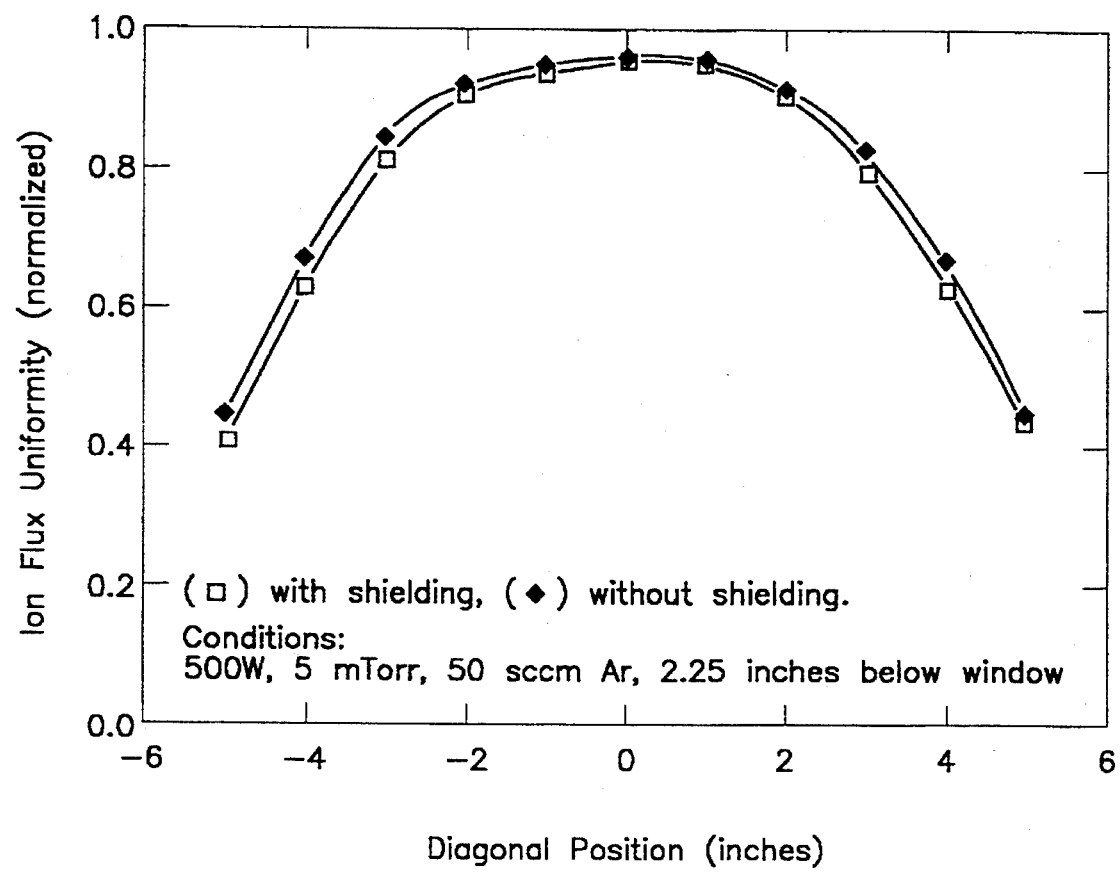
FIG. 6 shows the data of FIG. 5 normalized to the same peak values.

FIG. 5 plots the measured ion saturation current as a function of diagonal position in the plasma with and without shielding. The shielding increases the ion flux by 50%. FIG. 6 shows the data of FIG. 5 normalized to the same peak values to demonstrate that the ion flux uniformity is not adversely affected by these shields.

It is evident by inspection of the physical results and data shown in FIGS. 4–6, that the present invention is effective at reducing sputter contamination, while at the same time improving process rates in low pressure plasma processes.

In another preferred embodiment of the present invention, the electrically conducting shield is used to shape the RF field geometry of a non-planar inductive coil such that uniformity is improved. Shaping of the conductive shield forces the induction field to be more uniform within the plasma even when a helical coil is used, for example.

Figure 7:
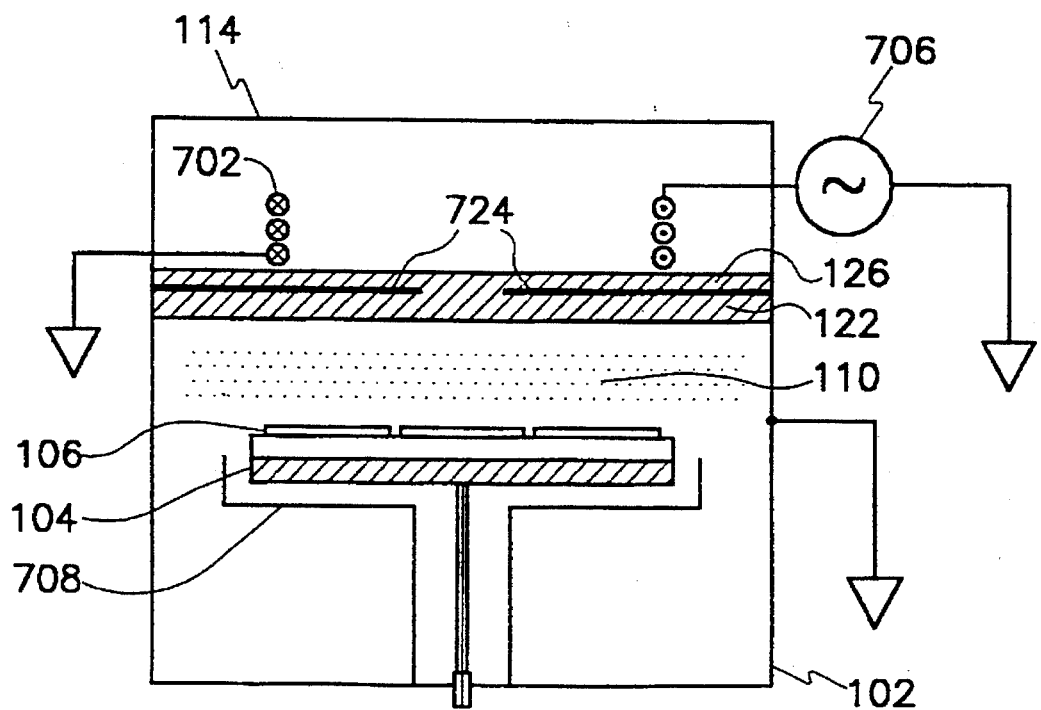
FIG. 7 shows a further embodiment of the present invention adapted for helical coils.

An RF induction plasma and ion source using a helical coil design together with the electrically conducting shield of the present invention are shown in FIG. 7. Rather than generating a plasma within the coil, as taught by Jacob, a planar plasma 110 below a helical coil 702 is generated using a grounded, electrically conducting shield 724 of the present invention.

Planar plasmas are desirable for treating planar workpieces such as silicon wafers and multi-chip packages. To improve uniformity the shaped conducting shields are used between the plasma and the end of the coil such that the RF fields are modified in shape to generate a more spatially uniform plasma. Thus, the present invention can be used for uniform plasma processing of large area materials. The present embodiment was implemented for uniformity over square surface areas, and hence, this embodiment is optimized for square-shaped plasma excitation. However, the principal of this design is applicable to many other geometries, as those skilled in the art will recognize.

FIG. 7 shows a low pressure (0.1–100 mTorr) plasma generated in a vacuum chamber 102. Radio frequency energy (13.56 MHz) is introduced by a helical coil 702 powered by a supply 706, to the discharge region through a quartz vacuum window 122 located at the top of the vacuum chamber 102. Both the chamber 102 and the end coil of helical coil 702 are grounded. An intense magnetic field is generated by the helical coil 702 which resides adjacent to the vacuum window 122 in the matchbox 114. The coil may consist of ¼ inch copper tubing wound about an 8 inch diameter coil form. FIG. 7 also shows that the substrate holder 104 for supporting the workpiece 106 may be protected by a shield 708.

Figure 8:
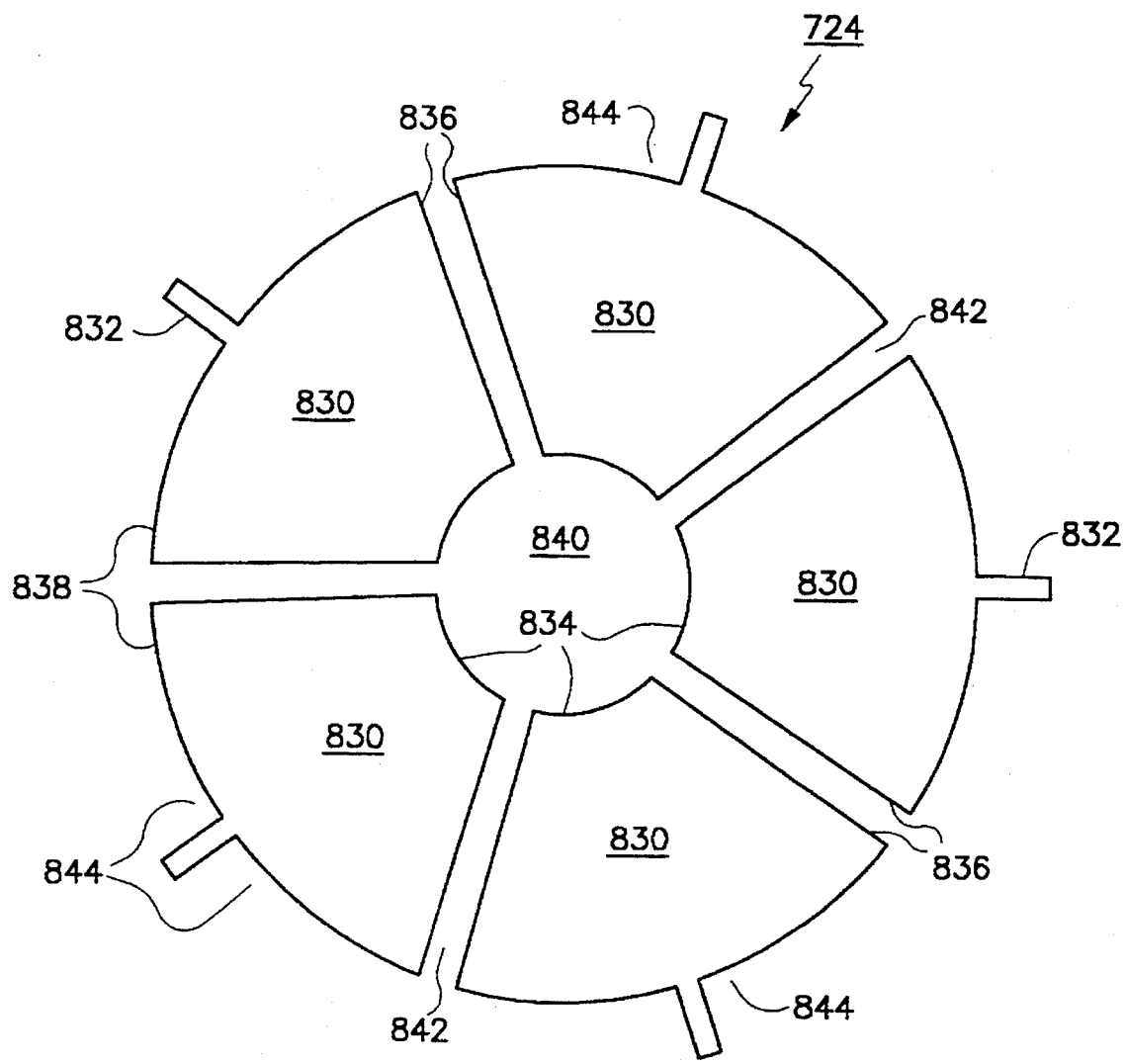
FIG. 8 shows electrically conducting shield for use with the helical coil embodiment.

FIG. 8 shows electrically conducting shield 724 for use with the helical coil embodiment. The electrically conducting shield 724 is similar in operation and structure to the shield 124 described above. The electrically conducting shield 724 comprises shield elements 830, ground leads 832, inner edge 834, side edge 836, outer edge 838, center opening 840, radial gaps 842 and outer gaps 844.

Magnetic flux lines loop through the helix coil and pass through the plasma region inducing an electric field in the plasma. The fields generated by the coil alone are somewhat non-uniform. The uniformity is improved by the grounded conducting shield between the coil and the plasma. The RF magnetic flux generated by the helical coil 702 is forced through the center region of the plasma 110. The flux's return path is then within the plasma and around the outside of the shaped conducting pieces of the shield. The shape of the fields, and hence the uniformity of plasma generation, is controlled by the shape of the conducting pieces. The shape of the coil is secondary, and may assume many spiral-like geometries. For additional uniformity, those skilled in the art will recognize that magnetic confinement of the plasma may be used.

The grounded end of the helical coil in the present embodiment is positioned near the plasma, thus capacitive electric fields between the coil and the plasma are very small compared to those generated by a spiral coil, thus grounding of the conductive shield 724 may not be necessary.

Figure 9:
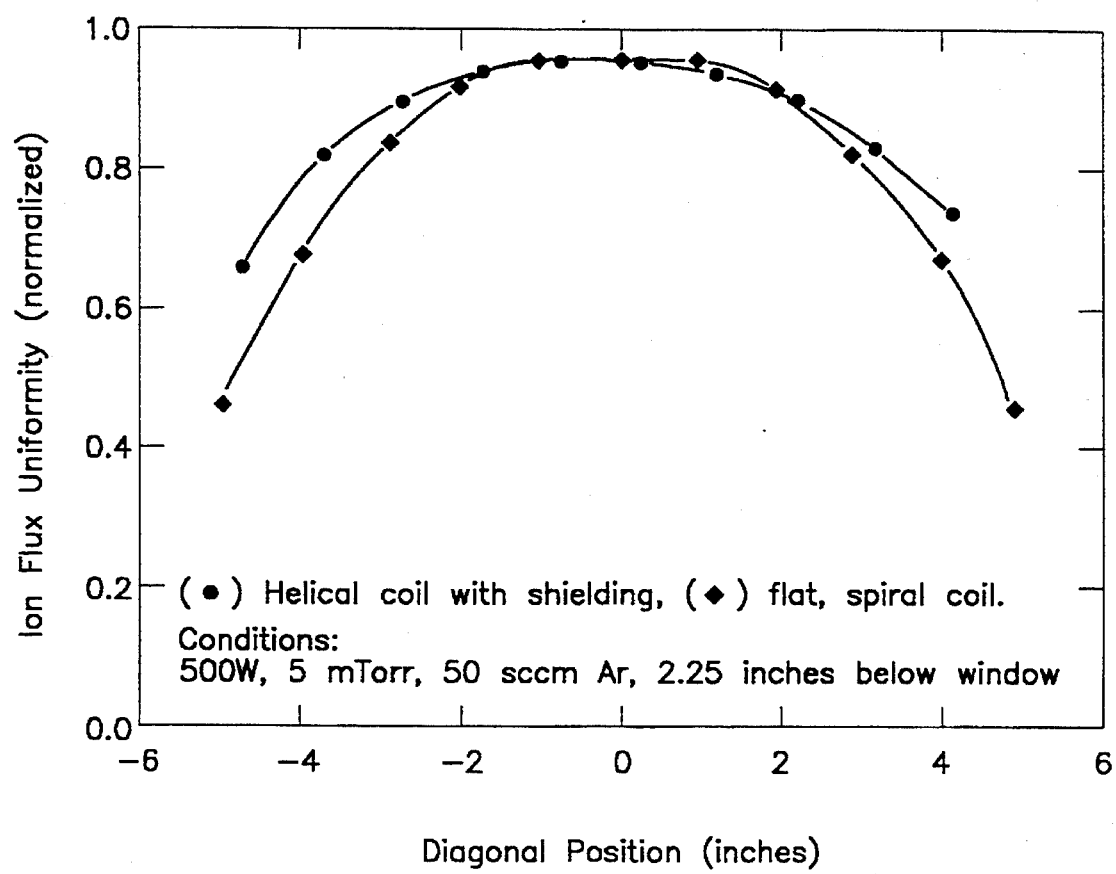
FIG. 9 shows a diagonal uniformity comparison between a preferred embodiment of the present invention and a conventional spiral coil.

The uniformity of plasma generated by the present embodiment is improved over conventional spiral couplers as shown in FIG. 9. The diagonal uniformity of the spiral coupler over about 20 cm is 19%, but, under identical conditions, a helical coil having a conducting shield of the present invention achieves 11% uniformity. The actual ion flux measured is approximately the same for both devices at (i.e., about 20 mA cm$^{-2}$).

While the invention has been particularly shown and described with reference to preferred embodiments thereof, it will be understood by those skilled in the art that the foregoing and other changes in form and details may be made therein without departing from the spirit and scope of the invention. All cited articles and patent documents in the above description are incorporated herein by reference.

Having thus described our invention, what we claim as new and desire to secure by Letters Patent is:

1. A method of plasma treating a workpiece with a uniform, high density plasma for enhanced processing and reduced sputter contamination, comprising the steps of:

supporting the workpiece in a process chamber, the process chamber having a dielectric window located in close proximity to the workpiece and a grounded, electrically conducting shield, wherein said shield has a periphery and an outer gap forming a substantially continuous opening about the periphery;

introducing a process gas into the process chamber;

inducing a high frequency current in a coil located outside the process chamber proximate to the dielectric window, wherein said high frequency current in turn produces a magnetic field which generates a substantially uniform and dense plasma of said process gas inside the process chamber for enhanced processing of the workpiece;

guiding the magnetic field through the outer gap of said shield, thereby providing an efficient return path for the magnetic field and maintaining the uniformity and density of said plasma; and shielding capacitive electric fields generated by the coil away from the dielectric window and toward ground to substantially reduce interference by the capacitive electric fields with inductive coupling between the coil and said plasma, thus substantially eliminating contamination from sputtering of the dielectric window by the capacitive electric fields.

2. The method of claim 1, wherein said shield includes a central opening and radial gaps.

3. A method of plasma treating a workpiece, comprising the steps of:

supporting the workpiece in a process chamber, the process chamber having a dielectric window located in close proximity to the workpiece and a grounded, electrically conducting shield, wherein said shield has a periphery, a central opening, and outer gaps forming a substantially continuous opening about the periphery;

introducing a process gas into the process chamber;

inducing a high frequency current in a coil located outside the process chamber proximate the dielectric window, wherein said high frequency current in turn produces a magnetic field having flux lines which generates a plasma of said process gas inside the process chamber;

establishing and maintaining the uniformity and density of said plasma for enhanced processing of the workpiece by routing the flux lines of said magnetic field through the central opening and outer gaps of said shield; and shielding capacitive electric fields generated by the coil away from the dielectric window and toward ground to substantially reduce interference by the capacitive electric fields with inductive coupling between the coil and said plasma, thus substantially eliminating contamination from sputtering of the dielectric window by the capacitive electric fields.

4. The method of claim 3, wherein the establishing and maintaining step further comprises:

routing the flux lines of said magnetic field through annular gaps which form a substantially continuous opening approximately a third of the radial distance from the central opening and the outer gaps.

5. The method of claim 3, wherein the shield and the coil are substantially flat and the coil is positioned substantially parallel to the dielectric window.

6. The method of claim 3, wherein the shield and the coil are substantially hemispherical in shape.

7. The method of claim 3, wherein the coil is helical in shape.

8. A method of plasma treating a workpiece in a process chamber, the process chamber having a dielectric window, a grounded electrically conducting shield, and a coil, wherein the shield has a periphery, a central opening, and outer gaps forming a substantially continuous opening about the periphery, and the coil is located outside the process chamber proximate the dielectric window, comprising the steps of:

supporting the workpiece in the process chamber in close proximity to the dielectric window and the coil;

introducing a process gas into the process chamber;

inducing a high frequency current in the coil, wherein said high frequency current in turn produces a magnetic field having flux lines which generates a plasma of said process gas inside the process chamber;

establishing and maintaining the uniformity and density of said plasma by routing the flux lines of said magnetic field through the central opening and outer gaps of the shield, thereby enhancing the processing the workpiece; and shielding capacitive electric fields generated by the coil away from the dielectric window and toward ground to substantially reduce interference by the capacitive electric fields with inductive coupling between the coil and said plasma, thus substantially eliminating contamination from sputtering of the dielectric window by the capacitive electric fields.

9. The method of claim 8, wherein the establishing and maintaining step further comprises:

routing the flux lines of said magnetic field through annular gaps which form a substantially continuous opening approximately a third of the radial distance from the central opening and the outer gaps.

10. The method of claim 8, wherein the shape of the shield substantially conforms with the shape of the workpiece for providing optimal uniformity over the workpiece.

\* \* \* \* \*